United States Patent
Isagawa et al.

(10) Patent No.: US 11,798,754 B2
(45) Date of Patent: Oct. 24, 2023

(54) ELECTRONIC APPARATUS, CONTACTLESS SWITCH, AND PHOTOELECTRIC SENSOR COMPRISING A HOUSING WITH A SUBSTRATE HOLDING PART FOR FIXING ONE OR MORE SUBSTRATES TO A PREDETERMINED POSITION

(71) Applicant: OMRON Corporation, Kyoto (JP)

(72) Inventors: Yuki Isagawa, Kyoto (JP); Kazuyoshi Nishikawa, Kyoto (JP)

(73) Assignee: OMRON Corporation, Kyoto (JP)

( * ) Notice: Subject to any disclaimer, the term of this patent is extended or adjusted under 35 U.S.C. 154(b) by 90 days.

(21) Appl. No.: 17/634,235

(22) PCT Filed: Mar. 5, 2020

(86) PCT No.: PCT/JP2020/009375
§ 371 (c)(1),
(2) Date: Feb. 9, 2022

(87) PCT Pub. No.: WO2021/049067
PCT Pub. Date: Mar. 18, 2021

(65) Prior Publication Data
US 2022/0301788 A1    Sep. 22, 2022

(30) Foreign Application Priority Data

Sep. 12, 2019  (JP) ................. 2019-166210

(51) Int. Cl.
*H01H 36/00* (2006.01)
*H01H 9/04* (2006.01)
(Continued)

(52) U.S. Cl.
CPC .............. *H01H 9/04* (2013.01); *H01H 35/00* (2013.01); *H05K 5/062* (2013.01); *H01H 2239/022* (2013.01)

(58) Field of Classification Search
CPC .......... H01H 35/00; H01H 36/00; H01H 9/04; H01L 21/50; H01L 21/52; H01L 21/56; H05K 5/06
(Continued)

(56) References Cited

U.S. PATENT DOCUMENTS

2022/0254663 A1\*   8/2022   Kakinuma ........ H01L 21/67132

FOREIGN PATENT DOCUMENTS

CN       102216616      10/2011
DE     202008000975     4/2008
(Continued)

OTHER PUBLICATIONS

"International Search Report (Form PCT/ISA/210) of PCT/JP2020/009375," dated Jun. 2, 2020, with English translation thereof, pp. 1-4.
(Continued)

*Primary Examiner* — Que Tan Le
(74) *Attorney, Agent, or Firm* — JCIPRNET

(57) ABSTRACT

An electronic apparatus has a housing in which a substrate with an electronic component mounted thereon, a thermoplastic hot-melt resin, and a substrate holding part are accommodated. The interior of the housing is divided by the substrate into a plurality of spaces. In the plurality of spaces, a distance between the substrate or the electronic component on the substrate and the substrate holding part, the housing, another substrate, or the electronic component on the another substrate is 0.3 mm to 1.5 mm.

8 Claims, 3 Drawing Sheets

(51) Int. Cl.
  *H01H 35/00* (2006.01)
  *H05K 5/06* (2006.01)
(58) Field of Classification Search
  USPC .......................................................... 250/230
  See application file for complete search history.

(56) References Cited

FOREIGN PATENT DOCUMENTS

| | | |
|---|---|---|
| DE | 202012010673 | 2/2013 |
| EP | 2884826 | 6/2015 |
| EP | 3139715 | 3/2017 |
| JP | H09216254 | 8/1997 |
| JP | H09321448 | 12/1997 |
| JP | H11364956 | 12/1999 |
| JP | 2009117515 | 5/2009 |
| JP | 2010251296 | 11/2010 |
| JP | 2013020739 | 1/2013 |
| JP | 2014172272 | 9/2014 |
| JP | 2016048739 | 4/2016 |
| JP | 2017228711 | 12/2017 |

OTHER PUBLICATIONS

"Written Opinion of the International Searching Authority (Form PCT/ISA/237) of PCT/JP2020/009375," dated Jun. 2, 2020, with English translation thereof, pp. 1-6.
Office Action of China Counterpart Application, with English translation thereof, dated Feb. 11, 2023, pp. 1-14.
"Search Report of Europe Counterpart Application", dated Sep. 4, 2023, pp. 1-9.

* cited by examiner

ELECTRONIC APPARATUS, CONTACTLESS SWITCH, AND PHOTOELECTRIC SENSOR COMPRISING A HOUSING WITH A SUBSTRATE HOLDING PART FOR FIXING ONE OR MORE SUBSTRATES TO A PREDETERMINED POSITION

CROSS-REFERENCE TO RELATED APPLICATION

This application is a 371 application of the International PCT application serial no. PCT/JP2020/009375, filed on Mar. 5, 2020, which claims the priority benefit of Japan Patent Application No. 2019-166210, filed on Sep. 12, 2019. The entirety of each of the above-mentioned patent applications is hereby incorporated by reference herein and made a part of this specification.

TECHNICAL FIELD

The disclosure relates to an electronic apparatus and the like in which a substrate having electronic components mounted thereon is provided in a housing and the housing is filled with a resin.

BACKGROUND ART

Conventionally, in an electronic apparatus in which a substrate having electronic components mounted thereon is provided in a housing, a space between the substrate and the interior of the housing is filled with a hot-melt resin for the purpose of protecting the substrate.

Patent Literature 1 discloses an electronic apparatus for suppressing deterioration of water resistance after sealing. Specifically, the electronic apparatus includes a sealing resin 120 which is formed in such a manner that a resin filled through a gate flows through a first flow path between an inner surface of a housing member and an outer surface of a flow control member and flows through a second flow path in the flow control member so that the resin spreads in the housing member and then is solidified. The cross-sectional shape of the first flow path and the cross-sectional shape of the second flow path are set so that the resin flowing through the first flow path reaches a second opening earlier than the resin flowing through the second flow path.

CITATION LIST

Patent Literature

Patent Literature 1: Japanese Patent Laid-Open No. 2014-172272

SUMMARY OF INVENTION

Technical Problem

However, in the electronic apparatus, since it is designed so that a flow end of a hot-melt resin is located on a substrate, adiabatic compression of a trapped gas may cause the deformation of the substrate and the breakage of the electronic component.

Further, when two or more different substrates are held inside the component, it is difficult to control the flow of the hot-melt resin. In this case, if the flow end of the hot-melt resin is brought onto the substrate as in the related art, it is necessary to widen the gap between the component and the interior of the housing. On the other hand, since the hot-melt resin has a large volume shrinkage during cooling, it is difficult to suppress the volume of the resin if the gap is large, and sink marks (dents due to deformation) occur.

Here, the disclosure has been made in view of the above-described problems and an objective thereof is to provide an electronic apparatus having an excellent sealing property.

Solution to Problem

The disclosure employs the following configuration in order to solve the above-described problems.

That is, an electronic apparatus according to an aspect of the disclosure (hereinafter, referred to as "this embodiment") includes: a housing; one or more substrates disposed in the housing, on which an electronic component is mounted; a thermoplastic hot-melt resin filled in the housing; and a substrate holding part for fixing the substrate to a predetermined position in the housing, wherein the interior of the housing is divided into a plurality of spaces, wherein the plurality of spaces are at least any space among a first space between the substrate and the substrate holding part, a second space between the housing and the substrate, and a third space between the substrates and each of the plurality of spaces is filled with the thermoplastic hot-melt resin, and wherein (1) a distance between the substrate or the electronic component mounted on the substrate and the substrate holding part when the first space exists, (2) a distance between the housing and the substrate or the electronic component mounted on the substrate when the second space exists, and (3) a distance between one substrate or the electronic component mounted on the substrate and the other substrate or the electronic component mounted on the other substrate when the third space exists are 0.3 mm to 1.5 mm.

Further, a contactless switch according to this embodiment includes two electronic apparatuses, the first electronic apparatus includes an actuator as the electronic component, the second electronic apparatus includes a sensor as the electronic component, and when a distance between the actuator and the sensor becomes a predetermined value or less, the output of the sensor is turned on.

Further, a photoelectric sensor according to this embodiment is a photoelectric sensor configured by the electronic apparatus and includes at least one of a light transmitting part and a light receiving part as the electronic component.

Effects of Invention

According to an aspect of the disclosure, it is possible to provide an electronic apparatus having an excellent sealing property.

DESCRIPTION OF EMBODIMENTS

Hereinafter, an embodiment according to an aspect of the disclosure (hereinafter, also referred to as an "embodiment") will be described with reference to the drawings.

§1. APPLICATION EXAMPLE

Figure 1:
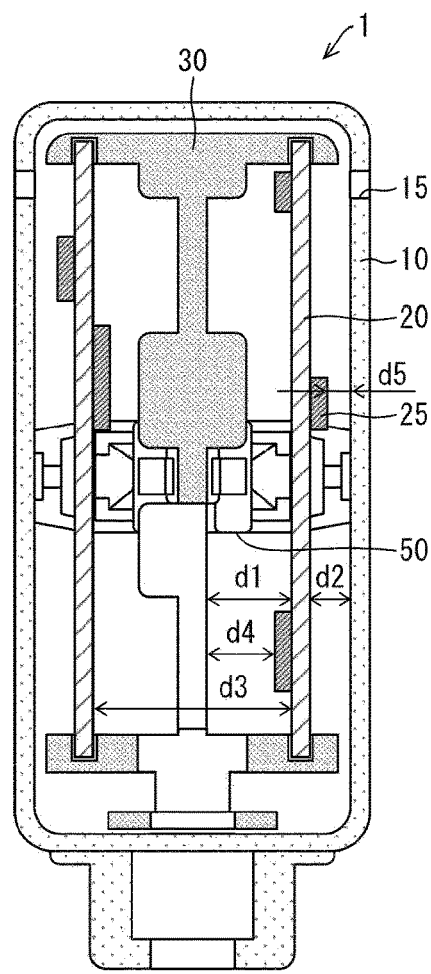
FIG. 1 is a diagram schematically showing a cross-section of an electronic apparatus according to this embodiment taken along the line A-A in FIG. 2.
Figure 2:
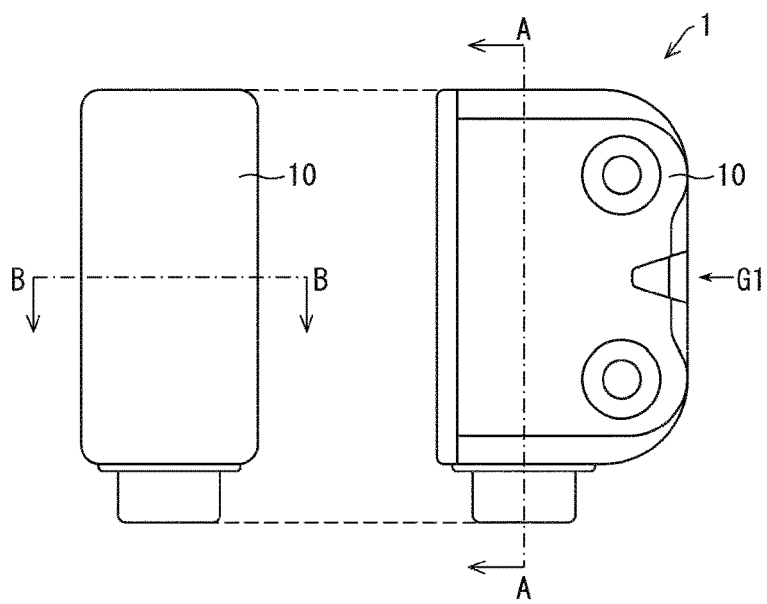
FIG. 2 is a diagram showing an example of an appearance of the electronic apparatus according to this embodiment.
Figure 5:
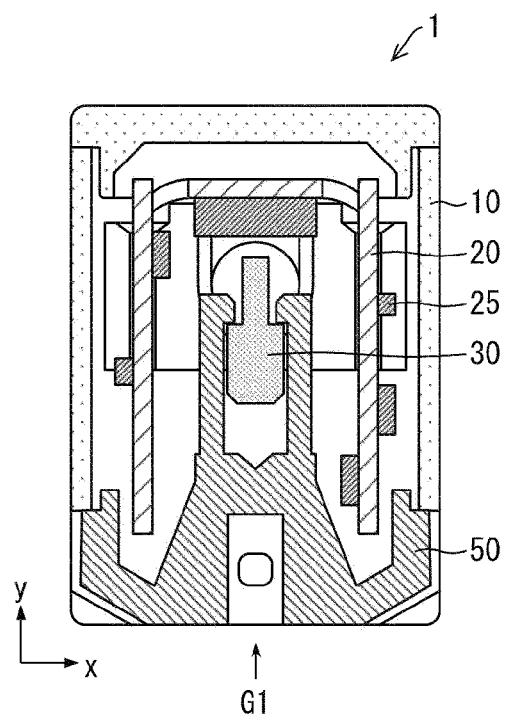
FIG. 5 is a diagram schematically showing a cross-section of the electronic apparatus according to this embodiment taken along the line B-B in FIG. 2.

An example of a situation in which the disclosure is applied will be described with reference to FIGS. 1, 2, and 5. FIG. 1 is a diagram schematically showing a cross-section of an electronic apparatus according to this embodiment taken along the line A-A in FIG. 2. FIG. 2 is a diagram showing an example of an appearance of the electronic apparatus according to this embodiment. FIG. 5 is a diagram schematically showing a cross-section of the electronic apparatus according to this embodiment taken along the line B-B in FIG. 2.

As shown in FIGS. 1 and 5, an electronic apparatus 1 according to this embodiment includes a housing 10, three substrates 20 which are disposed in the housing 10 and on which an electronic component 25 is mounted, and a substrate holding part 30 fixing the substrate 20 to a predetermined position in the housing 10. The housing 10 of this embodiment has an air vent 15 as an air escape hole. Further, in the electronic apparatus 1 according to this embodiment, a space of the housing 10 is filled with a thermoplastic hot-melt resin (not shown). Further, the electronic apparatus 1 according to this embodiment includes a fluid branch member 50 and the thermoplastic hot-melt resin is filled through the fluid branch member 50 in a direction indicated by an arrow G1 from the position indicated by the arrow G1 in FIG. 2.

The interior of the housing 10 of this embodiment is divided by the substrate 20 into (A) a space between the substrate 20 and the substrate holding part 30, (B) a space between the housing 10 and the substrate 20, and (C) a space between the substrates 20. In this application example, all of the distance between the substrate 20 or the electronic component mounted on the substrate 20 and the substrate holding part 30, the distance between the housing 10 and the substrate 20 or the electronic component mounted on the substrate 20, and the distance between one substrate 20 or the electronic component mounted on the substrate 20 and the other substrate 20 or the electronic component mounted on the substrate 20 are 0.3 mm to 1.5 mm.

The electronic apparatus 1 of this embodiment fills the thermoplastic hot-melt resin into the housing 10 at the time of manufacture. However, since each distance in the housing 10 is 0.3 mm to 1.5 mm, the fluidity of the thermoplastic hot-melt resin during filling is excellent and the space in the housing is sufficiently small. Therefore, it is possible to suppress the generation of the unfilled place of the thermoplastic hot-melt resin in the housing and the generation of sink marks of the thermoplastic hot-melt resin after cooling. Accordingly, in the embodiment according to an aspect of the disclosure, it is possible to decrease the volume of voids in the housing 10 and to provide the electronic apparatus 1 having an excellent sealing property.

§2. CONFIGURATION EXAMPLE

Hereinafter, an example of the configuration of the electronic apparatus 1 according to this embodiment will be described with reference to FIGS. 1, 2, and 5. In the example of FIGS. 1 and 5, the electronic apparatus 1 includes the housing 10, the substrate 20 on which the electronic component 25 is mounted, the thermoplastic hot-melt resin, the substrate holding part 30, and the fluid branch member 50. Hereinafter, the "thermoplastic hot-melt resin" is simply abbreviated as the "resin".

<Member Constituting Electronic Apparatus>
(Housing)

The housing 10 of this embodiment stores the substrate 20, the resin, the fluid branch member 50, and the substrate holding part 30 therein. In an example, the housing 10 may store cable components and the like connected to the substrate 20 in addition to the above.

The housing 10 of this embodiment is opened at a position indicated by G1 in order to fill the resin in a direction indicated by the arrow G1 from the position indicated by the arrow G1 in FIG. 5 when manufacturing the electronic apparatus 1 (filling port). Further, the housing 10 of this embodiment has the air vent 15 opened as an air escape hole so that the resin flowing when filling the filling port with the resin pushes out the air in the housing 10.

Further, the housing 10 is sealed when the filling port and the air vent 15 are sealed so that the electronic apparatus 1 has an excellent sealing property. The size and shape of the housing 10 may be appropriately designed in accordance with the usage method of the electronic apparatus 1. The housing 10 may be made of, for example, an acrylonitrile/butadiene/styrene copolymer (ABS) resin, a polybutylene terephthalate (PBT) resin, a polyphenylene sulfide (PPS) resin, or a polyamide (PA) resin.

(Substrate)

The substrate 20 of this embodiment is disposed in the housing 10 and the electronic component 25 is mounted thereon. Examples of the electronic component 25 that can be mounted on the substrate 20 include an antenna component, a light emitting element, a light receiving element, various sensor components, a control IC, an amplifier circuit, and a power supply circuit. The substrate 20 of this embodiment is composed of a glass epoxy substrate (FR-4), a glass composite substrate (CEM-3), a paper phenol substrate (FR-1, 2), and the like.

(Substrate Holding Part)

The substrate holding part 30 is a member for fixing the substrate 20 to a predetermined position in the housing 10. The size and shape of the substrate holding part 30 may be suitably designed in accordance with the application method of the electronic apparatus 1. In an example, the substrate holding part 30 can also fix the fluid branch member 50. In this case, the fluid branch member 50 may include a convex portion or a concave portion which can be combined with each other.

The substrate holding part 30 can be made of the same resin as the housing 10, but may be made of a material which is the same as or different from the material forming the housing 10.

(Fluid Branch Member)

The fluid branch member 50 of this embodiment is a member having a branched pipe for distributing the resin flowing into the housing 10 to a plurality of spaces in the housing 10. The fluid branch member 50 of this embodiment includes an opening which is an inlet for filling the resin into the housing 10 and a flow path part for guiding the resin from the opening into the space of the housing 10 (neither is shown).

The opening is an inlet for allowing the resin to flow into the fluid branch member 50 (a direction indicated by the arrow G1 in FIG. 5) from the outside in the process of manufacturing the electronic apparatus 1. In an example, the opening is located at a center portion of a surface opened in the fluid branch member 50. The flow path part includes a pipe having a branch following the opening and a groove provided in the opening at the tip of the branched pipe. Since the fluid branch member 50 includes the flow path part, the resin flowing from the opening can be passed through the pipe and flow into the groove at the tip thereof.

The cross-sectional area of the opening and the flow path part of the fluid branch member 50 is not particularly limited, but is 0.2 mm$^2$ or more as an example. In the electronic apparatus 1 according to this embodiment, since it is possible to control the fluidity of the resin by adjusting the size of the cross-sectional area of the opening and the flow path part of the fluid branch member 50, it is possible to suppress the generation of the unfilled place of the resin in the housing and the generation of sink marks of the resin after cooling without increasing the volume of the electronic apparatus 1 more than necessary. Therefore, it is possible to provide the electronic apparatus having an excellent sealing property.

(Resin)

As the resin (thermoplastic hot-melt resin) filled into the electronic apparatus 1 according to this embodiment, for example, any one of a polyamide-based resin, a polyester-based resin, and a polyolefin-based resin, or a combination thereof can be used. In an example, when a resin that can be molded at a low temperature (for example, 160° C. or more and 220° or less) and a low pressure (10 MPa or less) is used, it is possible to reduce heat damage and stress damage that may be given to various members such as the electronic component 25 and the cable component built in the housing 10 when manufacturing the electronic apparatus 1. Further, in this embodiment, from the viewpoint of further improving the fluidity of the resin and from the viewpoint of suppressing the generation of unfilled places of the resin even in a small space (for example, the shortest distance in the space is less than 1.0 mm) in the housing 10, for example, the melt viscosity of the resin can be 500 dPa s or less. From the viewpoint of improving the sealing performance of the electronic apparatus 1 (for example, oil resistance against cutting oil, water resistance satisfying standards such as IP67 and IP69K, and chemical resistance required for ECO-LAB certification at the time of commercialization), a polyamide-based resin or a polyester-based resin is preferably used, and among them, a polyester-based resin having crystallinity is preferable.

Additionally, the "polyamide-based resin" is a resin containing a constituent unit derived from polyamide as a main constituent element and includes a homopolymer of polyamide and both a monomer copolymerizable with polyamide and a copolymer of polyamide. The same applies to other resins listed as "based resins". Further, the "resin" includes not only a resin compound but also a mixture containing a filler such as silica, a stabilizer such as an antioxidant, and an additive such as a plasticizer.

<Arrangement of Members>

In the electronic apparatus 1 according to this embodiment, the above-described members are stored in the housing 10. Hereinafter, an example of the arrangement of the members in the housing 10 will be described with reference to FIGS. 1 and 5.

(Substrate)

In FIG. 5, three substrates 20 are provided in the housing 10 and are arranged as below. That is, in the vicinity of one surface along the x-axis direction of the housing 10 shown in FIG. 5, one substrate is disposed in parallel to the surface. Then, in the vicinity of two facing surfaces along the y-axis direction of the housing 10, one substrate is disposed in parallel to each surface. Additionally, in this embodiment, three substrates 20 are disposed, but the number of the substrates 20 provided in the electronic apparatus 1 according to the disclosure may be one more.

In this embodiment, the substrate 20 of this embodiment is fixed to a predetermined position in the housing 10 by the substrate holding part 30. Further, the substrate 20 may be further fixed to the housing 10. If the substrate 20 is firmly fixed, it is possible to prevent misalignment even when the flow stress of the resin to be filled is large.

The substrate 20 divides the space in the housing 10. In an example, the divided space may be a space between the substrate 20 and the substrate holding part 30, a space between the housing 10 and the substrate 20, or a space between the substrates 20 (they respectively correspond to a "first space", a "second space", and a "third space" of claims). The space in the housing 10 of this embodiment includes a space between the substrate 20 and the substrate holding part 30, a space between three substrates 20 and three sides of the housing 10 in the vicinity of the substrate 20, and a space surrounded by three substrates 20.

As will be described later, since the substrate holding part 30 in this embodiment is located in the space surrounded by the three substrates 20, the "space between the substrate 20 and the substrate holding part 30" can be included in the "space surrounded by three substrates 20".

As shown in FIG. 1, a description will be made on the assumption that a distance between the substrate 20 and the substrate holding part 30 is d1, a distance between the housing 10 and the substrate 20 is d2, a distance between one substrate 20 and the other substrate 20 is d3, a distance between the electronic component mounted on the substrate 20 and the substrate holding part 30 is d4, and a distance between the housing 10 and the electronic component provided on the substrate 20 is d5. In the electronic apparatus 1 according to this embodiment, d1 to d5 are all 0.3 mm to 1.5 mm. If d1 to d5 are in this range, since the fluidity of the resin when filling the resin is excellent and the space in the housing is sufficiently small, it is possible to suppress the generation of the unfilled place of the resin in the housing and the generation of sink marks of the resin after cooling. In such an electronic apparatus 1, since the volume of voids in the housing 10 is small, the sealing property is excellent.

Additionally, the "distance" means the "distance between the surface shape of the surface of the housing and the surface shape of the surface of the substrate holding part plate in the direction perpendicular to the surface while the surface of the housing is parallel to the surface of the substrate holding part plate constituting the substrate holding part".

(Substrate Holding Part)

The substrate holding part 30 of this embodiment is located in the space surrounded by three substrates 20. In an example, the substrate holding part 30 can fix the fluid branch member 50, but in that case, it is preferable not to disturb the flow of the resin flowing out of the fluid branch member 50.

As described above, the substrate holding part 30 of this embodiment can fix the substrate 20 so that all distances d1 to d5 are 0.3 mm to 1.5 mm.

Figure 3:
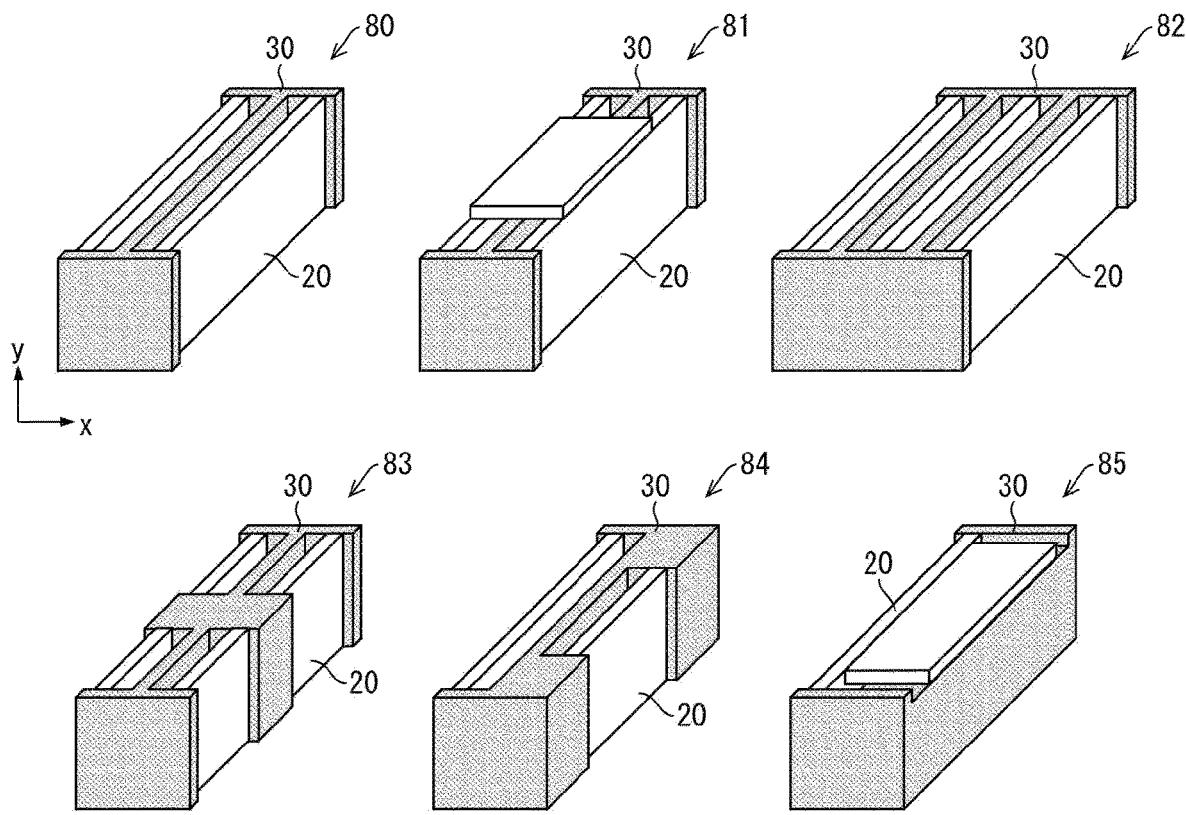
FIG. 3 is a schematic diagram showing an example of the arrangement of a substrate holding part and a substrate of the electronic apparatus according to this embodiment.

Additionally, the arrangement and shape of the substrate holding part 30 and the substrate 20 are not particularly limited, but can be set, for example, as shown in FIG. 3. FIG. 3 is a schematic diagram showing an example of the arrangement of the substrate holding part and the substrate of the electronic apparatus according to this embodiment. As shown in FIG. 3, in a structure 80 having the arrangement of the substrate holding part 30 and the substrate 20, the substrate holding part 30 fixes two substrates such that two facing surfaces in the cross-sections of two substrates 20 located in parallel are fixed and the substrate holding part 30 is located between the substrates 20.

In the substrate holding part 30 of a structure 81, one substrate 20 is further fixed as the third substrate 20 to one cross-section orthogonal to the cross-sections of two surfaces in the cross-sections of two substrates 20 of the structure 80. That is, the third substrate 20 is orthogonal to the other two substrates 20.

A structure 82 includes another substrate 20 in the structure 80 in parallel to two substrates 20 in the structure 80. In the third substrate 20 in the structure 82, the cross-sections of two facing surfaces are fixed by the substrate holding part 30 as in two substrates 20 of the structure 80. Further, the substrate holding part 30 is also located in two spaces between three substrates 20.

A structure 83 is formed such that two structures 80 are connected in the longitudinal direction of the substrate 20. However, the longitudinal length of the substrate 20 is shorter than the substrate 20 of the structure 80, so that the substrate 20 is more firmly fixed.

In the substrate holding part 30 of a structure 84, the cross-sections of both substrates 20 of two parallel substrates 20 of the structure 80 are fixed, but two substrates 20 have different longitudinal lengths. In the structure 84, since the length from the end portion of the substrate holding part 30 to the substrate 20 is different, two substrates 20 having different lengths are fixed.

In the substrate holding part 30 of a structure 85, one substrate 20 of two substrates 20 of the structure 80 is fixed at a position orthogonal to the other substrate 20. The substrate holding part 30 of the structure 85 for fixing the substrate 20 orthogonal to the substrate 20 of the structure 80 fixes one surface instead of the cross-sections of two facing surfaces of the substrate 20.

The above-described structure is merely an example, and the arrangement and shape of the substrate holding part 30 and the substrate 20 are not limited thereto.

(Fluid Branch Member)

The fluid branch member 50 of this embodiment includes the opening along the surface having the filling port so that the resin is filled from the filling port of the housing 10 toward the interior of the housing 10 (that is, in a direction indicated by the arrow G1 from the position indicated by the arrow G1 in FIG. 5) when manufacturing the electronic apparatus 1 and the flow path parts are stored in the housing 10.

In the fluid branch member 50 of this embodiment, as shown in FIG. 5, the flow path parts respectively continue to the plurality of spaces divided by the substrate 20. In this way, the electronic apparatus 1 of this embodiment has excellent fluidity of the resin when filling the resin. Therefore, it is possible to suppress the generation of the unfilled place of the resin in the housing 10.

In this embodiment, the fluid branch member 50 is fixed to the substrate holding part 30. As a fixing method, for example, a method of combining the convex portion and the concave portion respectively provided in the fluid branch member 50 and the substrate holding part 30 may be exemplified, but the disclosure is not limited thereto.

(Resin)

The resin (thermoplastic hot-melt resin) is filled into the spaces divided by the substrate 20 in the housing 10 and covers the substrate 20. The covering thickness of the resin is not particularly limited from the viewpoint of the sealing property, but is preferably 0.3 mm or more from the viewpoint of the voltage resistance of the electronic apparatus 1. In an example, when the covering thickness of the resin is 0.3 mm or more, a sufficient insulation protection function can be ensured.

Further, the resin is filled into the space of the housing without gaps from the viewpoint of water resistance and voltage resistance. In this embodiment, since all distances d1 to d3 of the space in the housing 10 filled with the resin are 0.3 mm to 1.5 mm, it is preferable that the covering thickness of the resin is 0.3 mm or more from the viewpoint that the fluidity of the resin when filling the resin is ensured, the generation of the unfilled place of the resin is suppressed, and the generation of sink marks of the resin after cooling is suppressed.

δ3. SEALING OF HOUSING BY RESIN

An example of a process of sealing the housing 10 by filling the resin into the housing 10 when manufacturing the electronic apparatus 1 is as below. First, the fluid branch member 50 is disposed in the housing 10 together with the substrate 20 and the substrate holding part 30 to which cable components and the like are connected as described above. The housing 10 storing each member is installed in a mold for resin molding and the resin is filled into the mold through the fluid branch member 50. Resin molding and filling can be performed according to a conventional method using an injection molding machine, a gear pump type applicator, or the like. That is, various conditions at the time of molding and filling the resin may be appropriately adjusted depending on the resin to be used and the electronic apparatus 1 to be manufactured. However, the components in the resin may separate when melted for a long time depending on the resin. In such a case, a molding machine that employs a sequential melting method may be used as the molding machine. The electronic apparatus 1 can be manufactured by filling the resin into the mold, cooling the resin in the mold, and then taking out the product.

In this embodiment, since the resin filled in the housing 10 has properties such as high viscosity, the resin is greatly affected by the flow resistance when the resin flows. The flow resistance decreases as the space in which the resin flows increases. The interior of the housing 10 is divided into a plurality of spaces by the substrate 20. However, since air cannot easily escape in the space having a large flow resistance and the adiabatic compression resistance of the air stops the flow of the resin, the unfilled place of the resin is generated. Further, since a force for expanding the space is generated, the deformation of the substrate 20 and the breakage of the electronic component 25 may be generated. However, when each space divided by the substrate 20 is expanded in order to reduce the flow resistance of the resin, a large amount of the resin is required for manufacturing the electronic apparatus 1.

As described above, in the process of manufacturing the electronic apparatus 1, the resin is filled into the housing 10 and then is cooled, but the resin has a large volume shrinkage during cooling. Therefore, when a large amount of the resin flows, the volume decrease amount due to cooling increases and sink marks occur in the resin. It is not preferable that the resin filled in the housing 10 has sink marks because air enters from the outside through the fitting portion of the housing 10 and the sealing property of the electronic apparatus 1 is impaired. Further, it is not preferable to expand each space divided by the substrate 20 from the viewpoint that the miniaturization of the electronic apparatus 1 is difficult.

In this embodiment, since all distances d1 to d3 between the members in the spaces divided by the substrate 20 are 0.3 mm to 1.5 mm, it is possible to sufficiently minimize the space in the housing 10 and hence to suppress the generation of sink marks of the resin after cooling. Further, it is possible to guide the flow end of the resin to the air vent 15 and to suppress the generation of the unfilled place of the resin in the housing 10. Accordingly, since it is possible to decrease the volume of voids in the housing of the electronic apparatus, it is possible to provide the electronic apparatus having an excellent sealing property. It is preferable to suppress the generation of the unfilled place of the resin in the housing 10 and to increase the sealing property of the electronic apparatus because the water resistance and voltage resistance of the electronic apparatus 1 can be improved.

Further, the electronic apparatus 1 according to this embodiment includes the fluid branch member 50. As shown in FIG. 5, the flow path part of the fluid branch member 50 continues to each of the plurality of spaces divided by the substrate 20. Therefore, the electronic apparatus 1 of this embodiment can more reliably guide the flow end of the resin to the air vent 15 when filling the resin and suppress the generation of the unfilled place of the resin in the housing 10. Thus, according to an aspect of the disclosure, it is possible to provide the electronic apparatus 1 having an excellent sealing property and a small size.

§4. APPLICATION EXAMPLE OF ELECTRONIC APPARATUS

Figure 6:
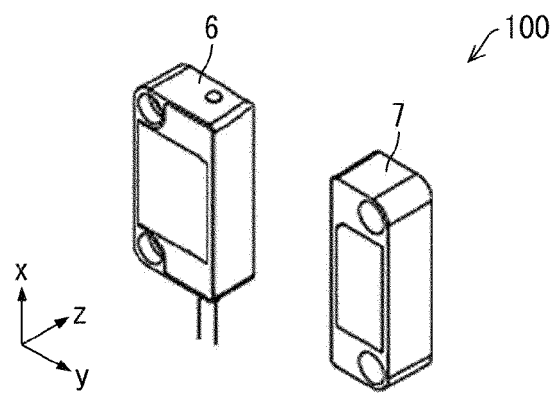
FIG. 6 is a diagram showing an example of a contactless safety switch using the electronic apparatus according to this embodiment.
Figure 7:
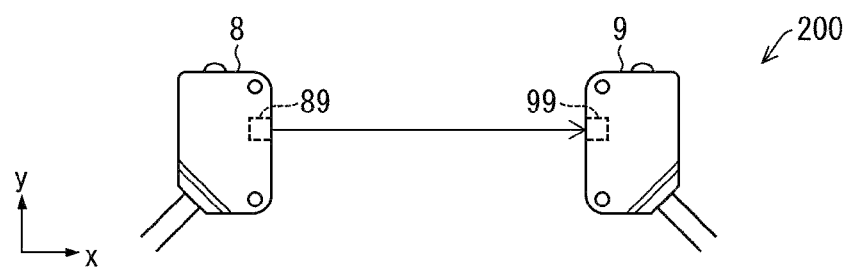
FIG. 7 is a diagram showing an example of a photoelectric sensor using the electronic apparatus according to this embodiment.

The electronic apparatus 1 according to this embodiment can be applied to, for example, a contactless safety switch and a photoelectric sensor. Hereinafter, a description will be made with reference to FIGS. 6 and 7. FIG. 6 is a diagram showing an example of the contactless safety switch using the electronic apparatus according to this embodiment. FIG. 7 is a diagram showing an example of the photoelectric sensor using the electronic apparatus according to this embodiment.

(Application Example to Contactless Safety Switch)

FIG. 6 is a diagram showing a configuration example when the electronic apparatus 1 is applied to a contactless safety switch 100 (contactless switch). The contactless safety switch 100 is realized by the combination of the electronic apparatus 1 functioning as an actuator 6 and the electronic apparatus 1 functioning as a sensor body 7. When the distance between the actuator 6 and the sensor body 7 becomes a predetermined value or less, the output of the sensor body 7 is turned on. Meanwhile, when the distance between the actuator 6 and the sensor body 7 becomes larger than the predetermined value, the output of the sensor body 7 is turned off. Examples of the contactless safety switch 100 include a reed switch type and an RFID type.

The reed switch type has a structure in which a magnet functioning as an electronic component is built in the actuator 6 and a plurality of reed switches functioning as electronic components are built in the sensor body 7. When the distance between the actuator 6 and the sensor body 7 becomes short, the magnetic field in the sensor body 7 becomes stronger, so that the contact of the reed switch is operated and the output from the sensor body 7 is turned ON.

The RFID type has a structure in which RFID functioning as an electronic component is built in the actuator 6 and an RFID reader functioning as an electronic component is built in the sensor body 7. When the actuator 6 approaches the sensor body 7, the RFID reader of the sensor body 7 reads ID data from the RFID of the actuator 6. If the ID data matches the previously stored ID, the output of the sensor body 7 is turned on. In this way, since the RFID type performs ID verification, it is possible to prevent malfunction even when another RFID or another type of RFID is read (invalidation prevention function). Further, it is possible to detect a failure of the sensor itself by executing software on the IC provided in the sensor body 7.

As described above, since the contactless safety switch 100 has no sliding portion, no wear debris is generated due to sliding. Thus, the contactless safety switch 100 can be suitably used as a switch for detecting the opening/closing of a safety door in a semiconductor manufacturing apparatus, a food or cosmetics manufacturing line, or the like. Further, since the electronic apparatus 1 has a structure in which the resin is filled in the housing 10 as described above, the electronic apparatus is less susceptible to water and dust from the surroundings during cleaning. Thus, it is possible to provide the more reliable contactless safety switch 100.

(Application Example to Photoelectric Sensor)

FIG. 7 is a diagram showing a configuration example when the electronic apparatus 1 is applied to a photoelectric sensor 200. The photoelectric sensor 200 is realized by a combination of the electronic apparatus 1 functioning as a light transmitting part 8 and the electronic apparatus 1 functioning as a light receiving part 9. Additionally, one electronic apparatus 1 may be a photoelectric sensor 200 functioning as both the light transmitting part 8 and the light receiving part 9.

When the light transmitted through the light transmitting part 8 is blocked or reflected by a detection object, the amount of the light reaching the light receiving part 9 changes. The light receiving part 9 detects this change, converts the change into an electric signal, and outputs the electric signal. The electronic apparatus 1 functioning as the light transmitting part 8 includes a light emitting element 89 as an electronic component and the electronic apparatus 1 functioning as the light receiving part 9 includes a light receiving element 99 as an electronic component. Additionally, the electronic apparatus 1 functioning as the light transmitting part 8 may further include a power supply part and the electronic apparatus 1 functioning as the light receiving part 9 may further include an amplification part, a control part, and a power supply part.

In this way, since the photoelectric sensor 200 can detect a detection object without mechanically touching the object, the detection object and the sensor itself are less likely to be scratched and worn. Thus, the photoelectric sensor can be suitably used to detect an object in a semiconductor manufacturing apparatus, a food or cosmetics manufacturing line, or the like similarly to the contactless safety switch 100. Further, since the electronic apparatus 1 has a structure in which the resin is filled in the housing 10 as described above, the electronic apparatus is less susceptible to water and dust from the surroundings during cleaning. Thus, it is possible to provide the more reliable photoelectric sensor 200.

δ5. MODIFICATION

Figure 4:
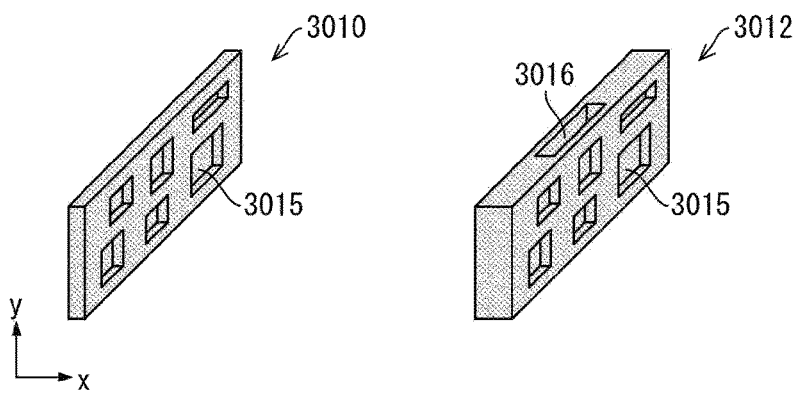
FIG. 4 is a perspective view schematically showing a substrate holding part of an electronic apparatus according to a modification of this embodiment.

Another embodiment of the disclosure will be described with reference to FIG. 4. FIG. 4 is a perspective view schematically showing a substrate holding part of an electronic apparatus according to a modification of this embodiment. For convenience of description, the same reference numerals are given to the members having the same functions as the members described in the above-described embodiment, and the description thereof will not be repeated.

A substrate holding part 3010 of this modification includes a flow guide structure for guiding the flow of the resin when the resin is filled. More specifically, the flow guide structure is a concave portion 3015 provided on the surface of the substrate holding part 30. The substrate holding part 3010 of this modification can control the flow of the resin by appropriately adjusting the distance between the members in each space of the housing 10 using the concave portion 3015. Therefore, it is possible to more reliably suppress the generation of the unfilled place of the resin in the housing 10. The shape and arrangement of the concave portion 3015 are not particularly limited and may be appropriately set according to the application method of the electronic apparatus 1.

Further, the flow guide structure may further include a through-hole 3016 penetrating from one surface to the other surface in addition to the concave portion 3015 as in a substrate holding part 3012 shown in FIG. 4. Since the substrate holding part 3012 further includes the through-hole 3016, for example, the flow end of the resin in the housing 10 can be guided to a desired space. Since it is possible to control the flow of the resin in accordance with the shape and the like in the housing 10, it is possible to suppress the generation of the unfilled place of the resin in the housing and the generation of sink marks of the resin after cooling. Therefore, it is possible to provide the electronic apparatus having an excellent sealing property. Additionally, the shape and arrangement of the through-hole 3016 are not particularly limited and may be appropriately designed.

SUMMARY

The disclosure employs the following configuration in order to solve the above-described problems.

That is, an electronic apparatus according to an aspect of the disclosure (hereinafter, referred to as "this embodiment") includes: a housing; one or more substrates disposed in the housing, on which an electronic component is mounted; a thermoplastic hot-melt resin filled in the housing; and a substrate holding part for fixing the substrate to a predetermined position in the housing, wherein the interior of the housing is divided into a plurality of spaces, wherein the plurality of spaces are at least any space among a first space between the substrate and the substrate holding part, a second space between the housing and the substrate, and a third space between the substrates and each of the plurality of spaces is filled with the thermoplastic hot-melt resin, and wherein (1) a distance between the substrate or the electronic component mounted on the substrate and the substrate holding part when the first space exists, (2) a distance between the housing and the substrate or the electronic component mounted on the substrate when the second space exists, and (3) a distance between one substrate or the electronic component mounted on the substrate and the other substrate or the electronic component mounted on the other substrate when the third space exists are 0.3 mm to 1.5 mm.

In the process of manufacturing the electronic apparatus according to an aspect of the disclosure, the thermoplastic hot-melt resin is allowed to flow into the housing and is cooled. The thermoplastic hot-melt resin has the properties of high flow resistance in a small space and a large volume shrinkage during cooling. Therefore, when filling the thermoplastic hot-melt resin, the unfilled place of the resin may be generated in a particularly small space in the housing or other components in the housing may be compressed. However, if the space in the housing is increased, a large amount of the resin will flow thereinto and the volume decrease amount will increase, so that sink marks occur in the finished resin.

However, according to the above-described configuration, since the fluidity of the resin when filling the thermoplastic hot-melt resin is excellent and the space in the housing is also sufficiently small, it is possible to suppress the generation of the unfilled place of the thermoplastic hot-melt resin in the housing and the generation of sink marks of the thermoplastic hot-melt resin after cooling. Accordingly, since the volume of voids in the housing of the electronic apparatus can be decreased, it is possible to provide the electronic apparatus having an excellent sealing property.

Additionally, the "distance" means the "distance between the surface shape of the surface of the housing and the surface shape of the surface of the substrate holding part plate in the direction perpendicular to the surface when the surface of the housing is parallel to the surface of the substrate holding part plate constituting the substrate holding part". Further, the "resin" includes not only resin compounds but also mixtures containing fillers such as silica, stabilizers such as antioxidants, and additives such as plasticizers.

In the electronic apparatus according to the above-described embodiment, the substrate holding part may include a flow guide structure for guiding a flow of the thermoplastic hot-melt resin when the thermoplastic hot-melt resin is filled. According to this configuration, since it is possible to suppress the generation of the unfilled place of the thermoplastic hot-melt resin in the space of the housing by controlling the flow of the thermoplastic hot-melt resin, it is possible to provide the electronic apparatus having an excellent sealing property.

In the electronic apparatus according to the above-described embodiment, the flow guide structure may be a through-hole penetrating from one surface of the substrate holding part to the other surface thereof. According to the above-described configuration, since it is possible to more reliably suppress the generation of the unfilled place of the thermoplastic hot-melt resin in the space of the housing by controlling the flow of the thermoplastic hot-melt resin, it is possible to provide the electronic apparatus having an excellent sealing property.

In the electronic apparatus according to the above-described embodiment, the flow guide structure may be a concave portion provided on a surface of the substrate holding part. According to the above-described configuration, since it is possible to more reliably suppress the generation of the unfilled place of the thermoplastic hot-melt resin in the space of the housing by controlling the flow of the thermoplastic hot-melt resin, it is possible to provide the electronic apparatus having an excellent sealing property.

In the electronic apparatus according to the above-described embodiment, the electronic apparatus may further include a fluid branch member that includes an opening serving as an inlet for filling the thermoplastic hot-melt resin into the housing and a flow path part for guiding the thermoplastic hot-melt resin from the opening to the space. According to the above-described configuration, since it is possible to more reliably suppress the generation of the unfilled place of the resin in the space of the housing by controlling the flow of the thermoplastic hot-melt resin, it is possible to provide the electronic apparatus having a further excellent sealing property.

In the electronic apparatus according to the above-described embodiment, the thermoplastic hot-melt resin may be any one of a polyamide hot-melt resin, a polyester hot-melt resin, and a polyolefin hot-melt resin or a combination thereof. According to this configuration, since the electronic apparatus can be filled with the resin at low temperature and low pressure, it is possible to reduce heat damage and stress damage to the built-in electronic components, resin components such as housings, cables, and the like. Here, the "polyamide-based resin" is a resin containing a constituent unit derived from polyamide as a main constituent element and includes a homopolymer of polyamide and both a monomer copolymerizable with polyamide and a copolymer of polyamide. The same applies to other resins listed as "based resins".

Further, a contactless switch according to this embodiment includes two electronic apparatuses, the first electronic apparatus includes an actuator as the electronic component, the second electronic apparatus includes a sensor as the electronic component, and when a distance between the actuator and the sensor becomes a predetermined value or less, the output of the sensor is turned on.

Further, a photoelectric sensor according to this embodiment is a photoelectric sensor configured by the electronic apparatus and includes at least one of a light transmitting part and a light receiving part as the electronic component.

The disclosure is not limited to the above embodiments and modifications and can be modified into various forms within the scope of the claims. That is, an embodiment obtained by combining technical means appropriately modified within the scope of the claims is also included in the technical scope of the disclosure.

δ6. EXAMPLES

Examples are shown below and embodiments of the disclosure will be described in more detail. Of course, the disclosure is not limited to the following examples, and it goes without saying that various aspects are possible for details.

Examples

The electronic apparatuses described with reference to FIGS. 1, 2, and 5 in the above-described embodiments were manufactured, and the filled state, water resistance, and voltage resistance of the resin in the housing were evaluated.

(Manufacture of Electronic Apparatus)

Toyobo's Vyloshot (polyester) was used as the resin, and Canon Electronics' LS-300i was used as the molding machine. The molding machine was set to have a cylinder temperature of 240° C., an injection speed of 20 mm/sec, and an injection pressure of 4.0 MPa.

(Evaluation)

As an evaluation of the filled state, an X-ray inspection device was used to confirm the presence or absence of unfilled places communicating with the outside of the housing.

As an evaluation of water resistance, an IP67 standard test and an IP69K standard test were conducted to confirm whether or not the criteria were satisfied.

As an evaluation of voltage resistance, it was confirmed whether or not the standards IEC 60947-5-2 and IEC 60947-5-2 were satisfied.

(Result)

Filled state: No unfilled place communicating with the outside of the housing was found.

Water resistance: The insulation resistance value after the test exceeded 2.55 GΩ, which satisfied the criteria in both standards.

Voltage resistance: The leakage current under AC 1000 V was 1 mA or less, which satisfied all criterion.

Comparative Example

The operation was performed in the same manner as in the examples except that the electronic apparatus was not provided with the substrate holding part. The result was as follows.

Filled state: The unfilled place communicating with the outside of the housing was found.

Water resistance: The insulation resistance value after the test was less than 20 MΩ, which did not satisfy the criteria of either standard.

Voltage resistance: The leakage current under AC 750V was 1 mA or more, which did not satisfy all criterion.

Further, a test for inspecting the filled state was performed by filling the resin while changing the distance between the housing 10 and the substrate 20 or the electronic component mounted on the substrate 20 (corresponding to the distance d2, the distance d5, and the like) to 0.1 mm to 1.7 mm in the space between the right substrate 20 and the right surface of the housing 10 in FIG. 1.

As a result, it was confirmed that good filling was performed without the unfilled place when the distance between the housing 10 and the substrate 20 or the electronic component mounted on the substrate 20 was 0.3 mm to 1.5 mm.

What is claimed is:

1. An electronic apparatus comprising:
a housing;
one or more substrates disposed in the housing, on which an electronic component is mounted;
a thermoplastic hot-melt resin filled in the housing; and
a substrate holding part for fixing the substrates to a predetermined position in the housing,
wherein the interior of the housing is divided into a plurality of spaces,
wherein the plurality of spaces are at least any space among a first space between the substrates and the substrate holding part, a second space between the housing and the substrates, and a third space between the substrates and each of the plurality of spaces is filled with the thermoplastic hot-melt resin, and
wherein (1) a distance between the substrates or the electronic component mounted on the substrates and the substrate holding part when the first space exists, (2) a distance between the housing and the substrates or the electronic component mounted on the substrates when the second space exists, and (3) a distance between one substrate or the electronic component mounted on the one substrate and the other substrate or the electronic component mounted on the other substrate when the third space exists are 0.3 mm to 1.5 mm.

2. The electronic apparatus according to claim 1,
wherein the substrate holding part comprises a flow guide structure for guiding a flow of the thermoplastic hot-melt resin when the thermoplastic hot-melt resin is filled.

3. The electronic apparatus according to claim 2,
wherein the flow guide structure is a through-hole penetrating from one surface of the substrate holding part to the other surface thereof.

4. The electronic apparatus according to claim 2,
wherein the flow guide structure is a concave portion provided on a surface of the substrate holding part.

5. The electronic apparatus according to claim 1, further comprising:
a fluid branch member, comprising an opening serving as an inlet for filling the thermoplastic hot-melt resin into the housing and a flow path part for guiding the thermoplastic hot-melt resin from the opening to the space.

6. The electronic apparatus according to claim 1,
wherein the thermoplastic hot-melt resin is any one of a polyamide hot-melt resin, a polyester hot-melt resin, and a polyolefin hot-melt resin or a combination thereof.

7. A contactless switch comprising:
two electronic apparatuses according to claim 1;
wherein the first electronic apparatus comprises an actuator as the electronic component,
wherein the second electronic apparatus comprises a sensor as the electronic component, and
wherein when a distance between the actuator and the sensor becomes a predetermined value or less, the output of the sensor is turned on.

8. A photoelectric sensor configured by the electronic apparatus according to claim 1, comprising:
at least one of a light transmitting part and a light receiving part as the electronic component.

* * * * *